(12) United States Patent
Tsukiji

(10) Patent No.: US 7,335,977 B2
(45) Date of Patent: Feb. 26, 2008

(54) SEMICONDUCTOR CHIP MOUNTING ARRANGEMENT

(75) Inventor: Masaharu Tsukiji, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/175,320

(22) Filed: Jul. 7, 2005

(65) Prior Publication Data

US 2007/0007650 A1 Jan. 11, 2007

(30) Foreign Application Priority Data

Jul. 7, 2004 (JP) ............................. 2004-200677

(51) Int. Cl.
*H01L 23/48* (2006.01)
*H01L 23/52* (2006.01)

(52) U.S. Cl. ................ 257/690; 257/692; 257/693; 257/E23.011; 257/E23.024

(58) Field of Classification Search ............... 257/690, 257/692, 693, 694, 695, E23.011, E23.024
See application file for complete search history.

(56) References Cited

U.S. PATENT DOCUMENTS 6,933,600 B2* 8/2005 Wu et al. .................... 257/691

2001/0035575 A1* 11/2001 Miyazaki et al. ........... 257/690
2005/0133889 A1* 6/2005 Urushido ..................... 257/666

FOREIGN PATENT DOCUMENTS

JP 6-110071 4/1994

* cited by examiner

*Primary Examiner*—Ngân V. Ngô
(74) *Attorney, Agent, or Firm*—Young & Thompson

(57) ABSTRACT

Disclosed is a device which comprises a substrate, a plurality of signal output terminal electrodes provided on the substrate, a plurality of signal input terminal electrodes provided on the substrate, and a display driver IC having input terminals thereof connected to the signal input terminal electrodes and output terminals thereof connected to the signal output terminal electrodes. A plurality of output terminals (first, third, fifth, . . . (i+1)th, and (n−1)th) are included on a first side of the display driver IC facing the signal input terminal electrodes. A second side on an opposite side of the first side faces the signal input terminal electrodes. Input terminals 22 are included in at least one segment of the second side, and output terminals (second, fourth, sixth, ith, jth, (j+2)th, (n−2)th, and nth) are included in at least one portion of the remaining segment of the second side. One output terminal on the second side passes between two of the output terminals on the first side that correspond to the one output terminal and is connected to a corresponding one of the signal output terminal electrodes through a corresponding one of wiring that passes through the underside of the display driver IC.

21 Claims, 6 Drawing Sheets

SEMICONDUCTOR CHIP MOUNTING ARRANGEMENT

FIELD OF THE INVENTION

The present invention relates to an IC (Integrated Circuit) for driving a display device. More specifically, the invention relates to a configuration suitable for being applied to a semiconductor device having output terminals for driving on two or more sides of the IC chip thereof for driving the display device, and the display device provided with the semiconductor device.

BACKGROUND OF THE INVENTION

Among display device driver circuits, data driver circuits (also referred to as "source drivers") include driver circuits each for driving a data line of a display panel (LCD (Liquid Crystal Display) panel, an EL (Electro Luminescence) panel, or the like) in parallel, corresponding to data lines for each line, for example. The data driver circuit inputs a digital video signal from a host device such as a CPU, for example, converts the digital video signal to a gray-scale voltage/current corresponding to the digital video signal, and drives the data line of the display panel by the gray-scale voltage/current. The output terminals of the driver circuit are provided corresponding to the data line terminals (terminal electrodes) of the display panel. On the other hand, in scan line driver circuits (also referred to as "gate drivers"), an output of the scan line driver circuit is connected to a gate line of the display panel, and the scan line driver circuit sequentially drives the gate line for a selected line at a high electric potential responsive to a synchronization control signal and a clock signal.

In recent years, the display device driver circuits tend to increase their outputs (or the number of data lines per line and the number of lines on a screen tend to increase), so that the chip size of ICs for driving the display devices (the data driver and the gate driver; hereinafter referred to as "driver ICs") and the area of a film for mounting the driver ICs thereon (or the number of sprocket holes) tend to increase.

As conventional display devices, there are employed a configuration in which driver IC chips are directly mounted on a glass substrate or the like (COG; Chip On Glass) and a configuration in which the IC chips are mounted on a film substrate (COF; Chip On Film) and interconnect electrodes of the film substrate are connected to corresponding interconnect electrodes of the glass substrate (data line and gate line electrodes). In either case of the COG and the COF, a plurality of output terminals of each driver IC is provided, corresponding to the positions in which the data or gate lines of the display panel to which the output terminals are connected are disposed.

FIG. 5 is a diagram showing an example of a configuration in which a semi-slim type driver IC is mounted on the film substrate. As a publication that discloses a configuration similar to that in FIG. 5, Patent Document 1, for example, is referred to. This Patent Document 1 describes that regarding electrodes for output terminals in a lower row of the driver IC mounted on a glass substrate, wiring need to be routed around from the driver-IC mounting portion to a corresponding output pad. Then, it is described that, due to the reason described above, the area of the glass substrate is increased, so that reduction of the size and weight of the liquid crystal display device cannot be achieved. FIG. 5 is the diagram showing an example in which a technical matter described in conjunction with a conventional art described in Patent Document 1 has been applied to the COF. In the following description, upper and lower and left and right such as in upper and lower sides and left and right sides will refer to the upper and lower and the left and right in appended drawings (plan views).

As shown in FIG. 5, in a semi-slim type driver IC chip 20A, output terminals 21 on the driver IC chip 20A are disposed on a plurality of sides. On the upper side of the driver IC chip 20A, first to ith output terminals are disposed in order on the left side of a region in which a plurality of input terminals 22 are arranged. (Referring to FIG. 5, numerals appended to the sides of the terminals on the IC chip 20A indicate the numbers of the output terminals.) On the upper side of the driver IC chip 20A, (i+1)th, (i+2)th, . . . (j−2)th, (j−1)th, and jth output terminals (in which the appended numerals for the upper and lower sides are serially numbered) are disposed in order from the left to the right. Further, on the lower side of the driver IC chip 20A, (j+1)th, (j+2)th, . . . , (n−1)th, and nth output terminals are disposed in order from the right to the left on the right side of the region in which the input terminals are arranged.

The first output terminal on the lower side of the driver IC chip 20A is connected to a corresponding output pad through wiring $14_1$, while the nth output terminal on the lower side is connected to a corresponding output pad 12 through wiring $14_n$. Likewise, the kth output terminal on the upper and lower sides of the IC chip 20A (in which k is an integer from 2 through n−1) is connected to a kth output pad 12 through corresponding wiring $14_k$. As a result, the n output terminals from the first, second, . . . (i−1)th, ith, jth, (j+1)th, and (n−1)th to the nth output terminal are connected in an order in which output pads 12 are arranged (in an order in which data lines or gate lines for connection are arranged). Incidentally, referring to FIG. 5, each of the output pads 12 and input pads 13 is not individually separated for illustration, but is shown as a box specifying an entire region, for simplicity (which also holds true for other drawings).

In the configuration shown in FIG. 5, a wiring routing region 17 for the output terminals on the longer side facing input pads 13 is required. In other words, it is necessary to provide a spacing 16 between the lower side of the input chip 20A and the wiring $14_1$ that is routed in an outermost direction. This spacing 16 is set to such a dimension just enough for routing wirings connected to i (from the first to the ith) output terminals and (n−j) (from the (j+1)th to the nth) output terminals on the left and right sides of the region in which the input terminals 22 are arranged on the lower side of the IC chip 20A to the output pads 12.

In the semi-slim type driver IC chip 20A, the output terminals are disposed on a plurality of chip sides of the semi-slim type driver IC chip 20A in an order of data lines to which the output terminals are connected, so that the size of the chip can be reduced more than in a slim type (refer to FIG. 6 that will be hereinafter described). However, in case the driver IC chip is mounted on a film substrate 10, the wiring routing region 17 becomes necessary. The reason why the wiring routing region 17 becomes necessary is that the film has a single-layer interconnection structure.

Then, in the case of the configuration shown in FIG. 5, the area of the film substrate 10 on which the chip is mounted is increased due to the presence of the wiring routing region 17, so that the number of sprockets 11 (the number of perforations) per film substrate is increased. This means reduction of the number of products manufactured per one film roll, which leads to an increase in the cost of the products.

On the other hand, in the case of the film substrate, there is no advantage in adopting a multi-layer interconnection structure. Further, when the film substrate is configured as a multi-layer substrate, an increase in the cost is brought about. For this reason, the single-layer interconnection having one interconnection layer on the film surface is widely used.

As described above, in the semi-slim type, the wiring routing region 17 becomes larger with an increase in the outputs of the driver IC. The larger the number of the output terminals on the lower side of the IC, the spacing 16 becomes larger. Thus, the number of the sprockets 11 per film substrate (the lengths of the film on both sides) is increased.

FIG. 6 is a diagram showing a configuration in which a conventional slim-type driver IC chip 20B has been employed. As shown in FIG. 6, in the slim-type driver IC, the output terminals are disposed on one side of the chip in the order of signal outputs (corresponding to the data lines or the gate lines to which the output terminals are connected). N driver circuits from one to n, drive the first to nth data lines (gate lines) from the left to the right of the display panel, respectively and the first to the nth output terminals on the IC chip 20B are disposed in order from the left to the right. In FIG. 6, the input terminals 22 are disposed in the whole range of the lower side. The input terminals, however, may be dummy terminals.

As shown in FIG. 6, the number of the sprockets 11 (the number of the perforations) per film substrate is set to five, which is smaller than that of the example shown in FIG. 5 (six). The number of the terminals on the upper side of the IC chip 20B, however, is increased more than that in the semi-slim type in FIG. 5. In other words, in the case of the slim-type chip, the area of the film can be reduced more than that in the semi-slim type. However, the chip size of the driver IC is increased.

Further, in the case of the slim-type chip, the number of needless spaces is increased on an input side (the side for inputting a digital video signal and a control signal). For this reason, reduction of the cost becomes difficult.

Further, in the case of the slim-type chip, the output terminals on the chip are all disposed on one side. Thus, design latitude of the chip (for circuit design and layout) is also constrained, so that design optimization becomes difficult.

[Patent Document 1]
JP Patent Kokai Publication No. JP-A-6-110071 (FIG. 5)

SUMMARY OF THE DISCLOSURE

Recently, the cost of the IC chip becomes substantially the same as the cost of the film. For this reason, in order to reduce the cost of the products, it is necessary to reduce the cost of the film substrate.

By the way, in the semiconductor device for which higher integration is achieved with development of a process for achieving a smaller geometry, downsizing of the chip is effected, and reduction of the cost is attempted. However, the actual condition is that downsizing of the film has not been performed yet.

The invention disclosed in the present application is summarized as follows:

A semiconductor device according to one aspect of the present invention includes:

a semiconductor chip having a plurality of terminals along a first side thereof and a plurality of terminals along a second side thereof, the second side facing said first side; and a substrate having a wiring on a surface thereof, the wiring being extended under the semiconductor chip from a terminal connection provided at a position corresponding to at least one of the terminals on the second side of the semiconductor chip and being led out from between associated ones of the terminals on the first side on the semiconductor chip or a side of the terminals on the first side on the semiconductor chip.

In the semiconductor device according to the present invention, it is preferable that the semiconductor chip is constituted from a data driver IC chip for driving a data line of a display device or a gate driver IC chip for driving a gate line of the display device. Further, in the present invention, it is preferable that the substrate is constituted from a film substrate or a glass substrate.

In the semiconductor device according to the present invention, a terminal of the semiconductor chip is formed of a bump protruded from a surface of the semiconductor chip, and connection is performed by contact of the bump against the electrode of the terminal connection of the substrate corresponding to the bump.

In the semiconductor device according to the present invention, on the surface of the substrate, signal electrodes are disposed. The signal electrodes are separated from the first side of said semiconductor chip, face the first side or the extended line of the first side, and are connected to the terminals on the first side and the terminals on the second side by wiring.

In the semiconductor device according to the present invention, the substrate is constituted from the film substrate, and the first side of the semiconductor chip and the signal electrodes are disposed in a direction perpendicular to a direction in which sprocket holes provided along an edge of at least one side of the film substrate are arranged.

A semiconductor device according to another aspect of the present invention comprises:

a semiconductor chip having a plurality of terminals arrayed along a first side thereof and a plurality of terminals arrayed along a second side thereof, said second side facing said first side; and a substrate having at least a wiring on a surface thereof, said wiring being led from a terminal connection provided at a position corresponding to at least one of the terminals arranged on said second side of said semiconductor chip to said first side of said semiconductor chip and being connected to a signal electrode disposed spaced apart from said first side;

wherein the plurality of terminals on said semiconductor chip includes;

ith, (i−1)th, . . . second and first output terminals arranged in order in a first segment extending over a predetermined width from an end of said second side;

(i+1)th through jth output terminals (where j larger than (i+1)) arranged in order from one end of said first side to the other end of said first side; and nth, (n−1)th, . . . , (j+2)th, and (j+1)th output terminal arranged in order from one end of a second segment to the other end of said second side, said second segment extending over a predetermined width from the other end of said second side;

wherein said first through ith output terminals on said second side are routed respectively on an extended line of an end of said first side in order from said first through ith output terminals by wirings passing through a predetermined wiring region; said first through ith output terminals being connected to first through ith signal electrodes, respectively;

said (i+1)th through jth output terminals (where j is larger than (i+1)) on said first side are connected to (i+1)th through jth signal electrodes arranged facing said first side, respectively; and said (j+1)th through nth output terminals on said second side are routed respectively on an extended line of the other end of said first side by wirings passing through a predetermined wiring region, said (j+1)th through nth output terminals being connected to jth through nth signal electrodes, respectively.

In the semiconductor device according to the present invention, it may so configured that the semiconductor chip includes:

a plurality of terminal groups provided on the first side, each of the plurality of terminal groups being constituted from n of the terminals among (n+1) of the terminals (in which n is an integer equal to one or larger); and a remaining one of the (n+1) of the terminals provided on the second side, the remaining one of the (n+1) of the terminals corresponding to each of the plurality of terminal groups on the first side; and the remaining one of the (n+1) of the terminals on the second side is routed out through adjacent two of the terminals in a corresponding one of the plurality of terminal groups on the first side by the wiring extended under the semiconductor chip from the terminal connection provided at a position corresponding to the remaining one of the (n+1) of the terminals.

In the semiconductor device according to the present invention, the semiconductor device chip may include in at least one region of the first side a free space with no terminals disposed thereon; and the terminals on the second side may be extended to the free space on the first side by the wiring.

A substrate according to other aspect of the present invention is the substrate for mounting a semiconductor chip thereon. The semiconductor chip has a plurality of terminals along a first side thereof and a plurality of terminals along a second side thereof. The second side faces the first side. The substrate includes: a wiring mounted on a surface of the substrate, the wiring being extended from a terminal connection provided at a position corresponding to each of the terminals on the second side of the semiconductor chip and then being led out from the first side of the semiconductor chip, or being routed in a direction of extension of the first side.

A substrate according to another aspect of the present invention is the substrate for mounting a semiconductor chip thereon. The semiconductor chip has a plurality of terminals along a first side thereof and a plurality of terminals along a second side thereof. The second side faces the first side. The substrate includes: a wiring mounted on a surface of the substrate with the semiconductor chip mounted thereon, the wiring being extended from a terminal connection provided at a position corresponding to each of the terminals on the second side of the semiconductor chip, and being led out from between adjacent ones of the plurality of terminals on the semiconductor chip.

The substrate according to the present invention may be a film substrate or a glass substrate.

In the substrate according to the present invention, each of the terminals on said semiconductor chip comprises a bump, said bump being protruded from a surface of said semiconductor chip; and connection is performed by contact of said bump against an electrode provided at the terminal connection on said substrate corresponding to said bump.

A semiconductor chip according to other aspect of the present invention has a plurality of terminals along a first side thereof and a plurality of terminals along a second side thereof. The second side faces the first side. The semiconductor chip includes:

a plurality (k) of the terminals for output disposed in order in a first segment, the first segment extending over a predetermined width from one end of the first side, the plurality of the output terminals being output terminals with odd ordinal numbers; and a plurality (k) of the terminals for output disposed in order in a second segment, the second segment extending over the predetermined width from one end of the second side, the plurality of the output terminals being output terminals with even ordinal numbers.

The semiconductor chip according to the present invention further includes:

a third segment extending over a predetermined width from the other end of the first segment of the first side;

a fourth segment extending over a predetermined width from the other end of the second segment of the second side;

a plurality (m) of the terminals for output arranged in order in a fifth segment, the fifth segment extending from an end of the third segment of the first side to the other end of the first side, the plurality of the output terminals being the output terminals with odd ordinal numbers; and a plurality (m) of the terminals for output arranged in order in a sixth segment, the sixth segment extending from an end of the fourth segment of the second side to the other end of the second side, the plurality of the output terminals being the output terminals with even ordinal numbers.

The semiconductor chip according to the present invention includes:

a plurality of the terminals for output disposed in order in one of the third segment and the fourth segment; and a plurality of the terminals for input in the other of the third segment and the fourth segment.

The semiconductor chip according to the present invention comprises:

a third segment extending over a predetermined width from the other end of said first segment of said first side;

a fourth segment extending over a predetermined width from the other end of said second segment of said second side;

a plurality (m) of the terminals for output with even ordinal numbers, arranged in a fifth segment, said fifth segment extending from an end of said third segment of said first side to the other end of said first side; and a plurality (m) of the terminals for output with odd ordinal numbers, arranged in a sixth segment, said sixth segment extending from an end of said fourth segment of said second side to the other end of said second side.

The semiconductor chip according to the present invention, further comprises:

a plurality of the terminals for output arranged in order in one of said third segment and said fourth segment; and a plurality of the terminals for input in the other of said third segment and said fourth segment.

A semiconductor chip according to another aspect of the present invention, which includes a plurality of terminals along a first side thereof and a plurality of terminals along a second side thereof, said second side facing said first side, comprises:

a plurality of terminal groups provided on said first side, each of said plurality of terminal groups comprising n of the terminals among (n+1) of the terminals (where n is an integer equal to one or larger); and a remaining one of the (n+1) of the terminals provided on said second side, the remaining one of the (n+1) of the terminals corresponding to each of said plurality of terminal groups on said first side.

A semiconductor chip according to still another aspect of the present invention, which includes a plurality of terminals arrayed along a first side thereof and a plurality of terminals arrayed along a second side thereof, said second side facing said first side, comprises:

a plurality of output terminal groups provided in a first segment, said first segment extending between one end of said first side and the other end of said first side, each of said plurality of output terminal groups comprising n of the terminals for output among (n+1) of the terminals for output (where n is an integer equal to one or larger), the (n+1) output terminals being serially numbered;

a remaining one of the (n+1) of the serially numbered output terminals provided in a second segment and a third segment, said second segment extending over a predetermined width from one end of said second side, said third segment extending over a predetermined width from the other side of said second side facing said one end of said second side, the remaining one of the (n+1) of the serially numbered output terminals corresponding to each of said plurality of output terminal groups on said first side; and a plurality of the terminals for input provided in a region between said second and third segments of said second side.

A semiconductor chip according to still another aspect of the present invention, which has a plurality of terminals arrayed along a first side thereof and a plurality of terminals arrayed along a second side thereof, said second side facing said first side, includes:

first through ith terminals for output (where i is larger than one) arranged in order in a first segment, said first segment extending over a predetermined width from one end of said first side;

(i+1)th through jth terminals for output (where j is larger than (i+1)) arranged in order in a second segment, said second segment extending over the predetermined width from one end of said second side;

(m+1)th through nth terminals for output (where n is larger than (m+1)) arranged in order in a third segment in a direction from said one end of said first side to the other end of said first side, said third segment extending over a predetermined width from said other end of said first side;

(j+1)th through mth terminals for output (where m is larger than (j+1)) arranged in order in a fourth segment in a direction from said one end of said second side to the other end of said second side, said fourth segment extending over the predetermined width from said other end of said second side; and a free space with no terminals disposed therein provided in a region between said first and third segments of said first side.

The semiconductor chip according to the present invention, is a data driver IC chip for driving a data line of a display device or a gate driver IC chip for driving a gate line of said display device.

A display driver device according to other aspect of the present invention includes:

a substrate;

a plurality of signal output electrodes provided on the substrate;

a plurality of signal input electrodes provided on the substrate; and a display driver IC with input terminals thereof connected to the signal input electrodes and output terminals thereof connected to the signal output electrodes; wherein the display driver IC include s a plurality of the output terminals on the first side of the display driver IC facing the signal output electrodes;

a second side in the opposite side of the first side of the display driver IC faces the signal input electrodes;

the display driver IC includes a plurality of the input terminals in at least one segment of the second side and a plurality of the output terminals in at least one portion of a remaining segment of the second side; and at least one of the output terminals on the second side passes through between adjacent two of the plurality of the output terminals on the first side corresponding to the at least one of the remaining ones of the output terminals or passes through a side of the adjacent two of the plurality of the output terminals on the first side, and then connected to a corresponding one of the signal output electrodes by a wiring passing under the surface of the display driver IC facing the substrate.

The meritorious effects of the present invention are summarized as follows.

According to the present invention, terminals on one side are routed to other side by wiring that passes through under the chip. Reduction of the size of the chip is thereby effected, and a wiring region on the substrate that mounts the chip thereon can also be reduced. The overall cost thus can be reduced.

Still other effects and advantages of the present invention will become readily apparent to those skilled in the art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
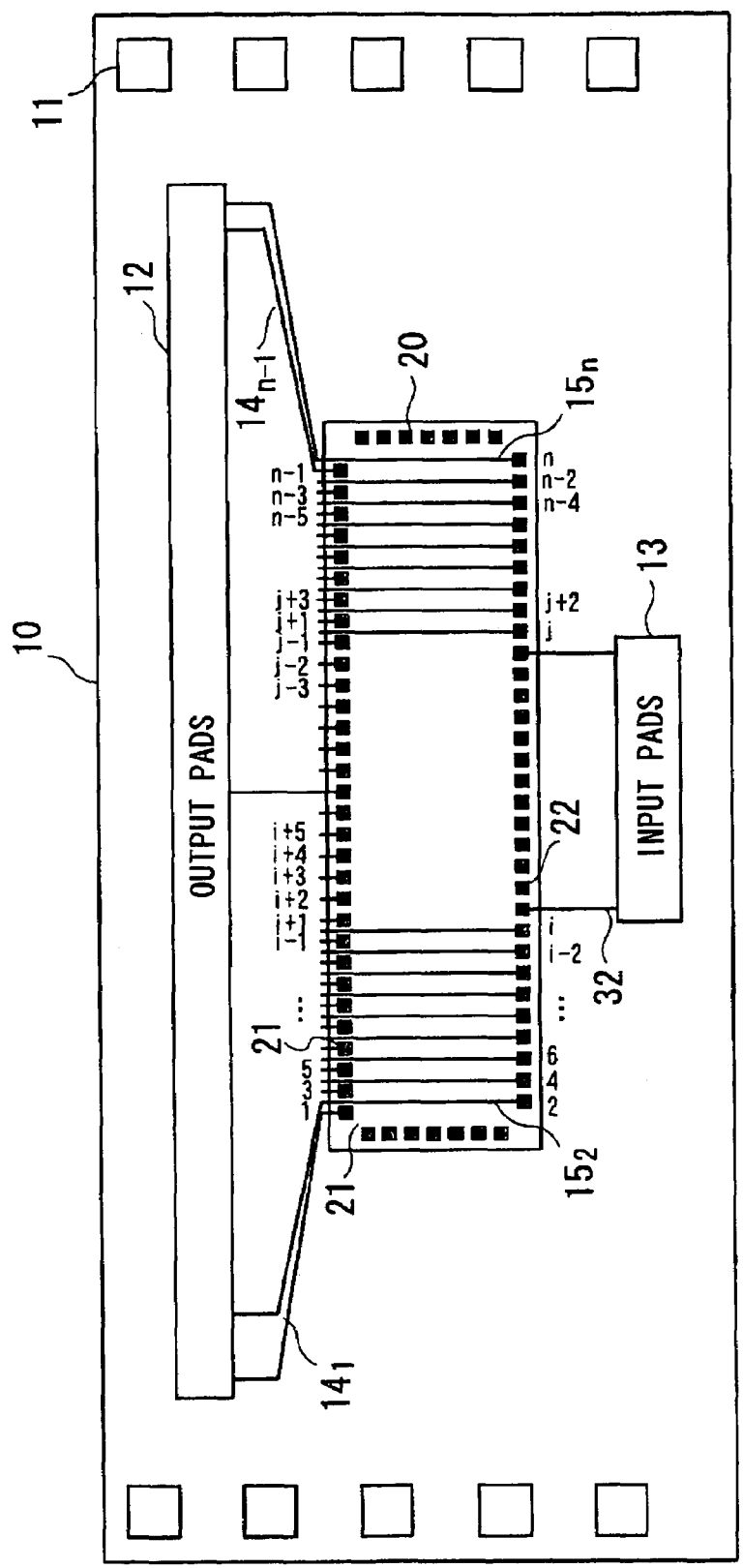
FIG. 1 is a diagram showing a planar configuration of a first embodiment of the present invention.

Preferred embodiments of the present invention will be described with reference to drawings. Referring to FIG. 1, a semiconductor device according to an embodiment of the present invention includes a substrate (10), a plurality of signal output pads (12) provided on the substrate (10), a plurality of signal input pads (13) provided on the substrate (10), a display driver IC (20)(a data driver or a gate driver) which has input terminals thereof connected to the signal input pads (13) and output terminals thereof connected to the signal output pads (12). As an example, the display driver IC (20) includes first, third, fifth, ..., (i+1)th, ..., (n−1)th output terminals on a first side of the display driver IC (20) facing the signal output pads (12). A second side on the opposite side of the first side faces the signal input pads (13), and at least one segment of the second side includes a plurality of input terminals (22), and at least one portion of the remaining segments of the second side includes second, fourth, sixth, ith, jth, (j+2)th, (n−2)th, and nth output terminals, for example. One of output terminals on the second side (such as the second output terminal) is routed between corresponding two output terminals (the first and third output terminals) on the first side and is connected to a corresponding signal output pad (12) through a wiring ($15_2$) that passes under the semiconductor chip (20) (under the surface of the semiconductor chip (20) opposed to the substrate).

Figure 3:
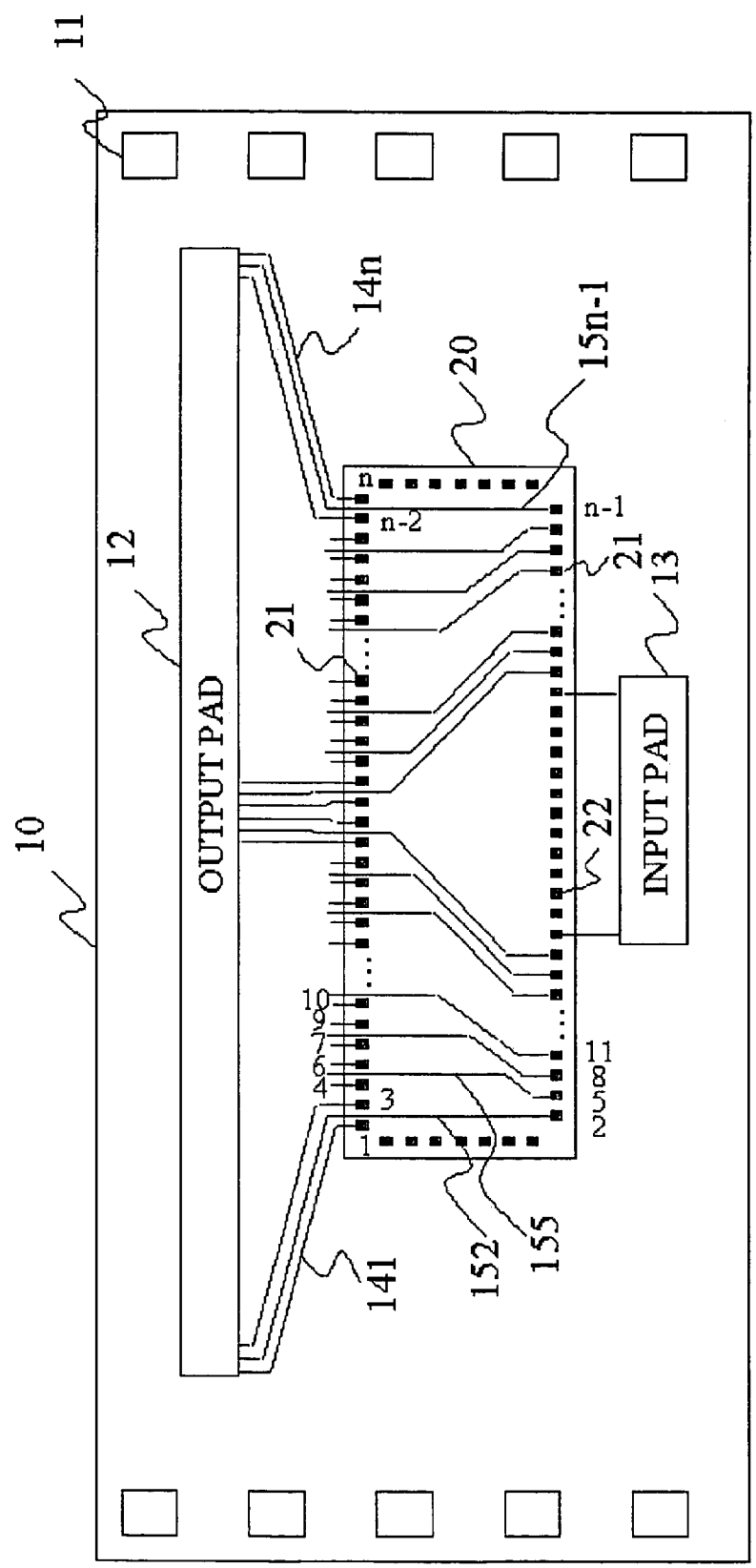
FIG. 3 is a diagram showing a planar configuration of a second embodiment of the present invention.

Further, referring to FIG. 3, the semiconductor chip (20) according to other embodiment of the present invention may be configured to includes a plurality of sets of output terminal groups on the first side. Each set is constituted from n (e.g. two) output terminals of (n+1) (e.g. three) serially numbered output terminals. The remaining one of the (n+1) output terminals is arranged on the second side, corresponding to each of the plurality of sets of output terminals on the first side. One of the output terminals on the second side (such as the second output terminal) may be routed between two adjacent output terminals of a corresponding set of output terminal groups (such as between the first and third output terminals) on the first side and led out, by the wiring $15_2$.

Figure 4:
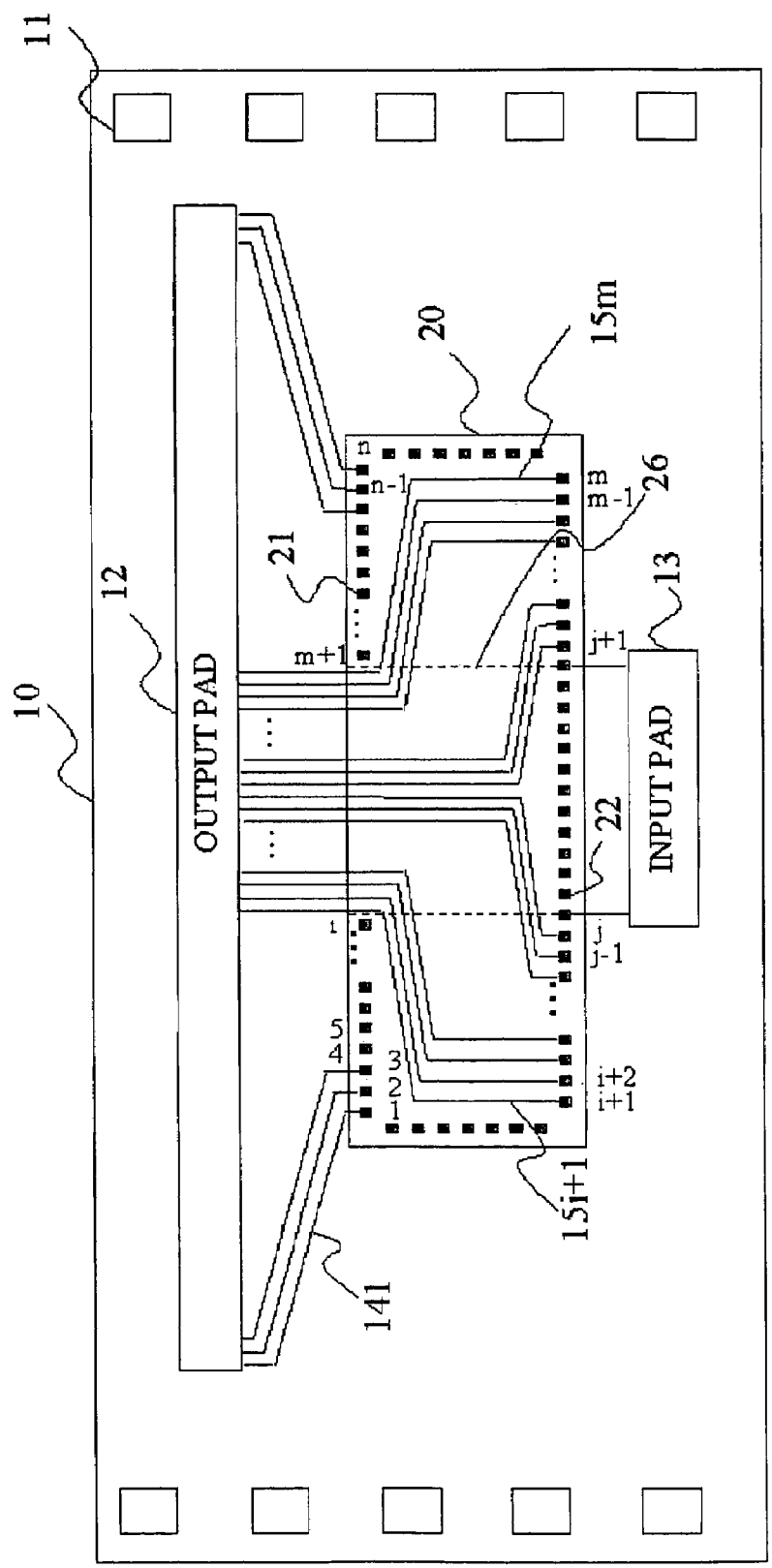
FIG. 4 is a diagram showing a planar configuration of a third embodiment of the present invention.

Further, referring to FIG. 4, the semiconductor chip (20) according to still another embodiment of the present invention includes a free region on which no terminals are disposed in at least one region on the first side (the region corresponding to a logic unit 26). Output terminals on the second side may be led out to the free region on the first side through wiring ($15_i$) disposed under the semiconductor chip (20).

The substrate (10) may be formed of a glass substrate as well as a film. Preferably, the interconnection structure on the surface of the substrate according to the embodiment of the present invention is single-layer. A more detailed description of the embodiments of the present invention will be given below.

FIG. 1 is a diagram showing a configuration of an embodiment of the present invention. Referring to FIG. 1, in the present embodiment, the driver IC chip 20 constituting the data driver or the gate driver is the IC chip of a semi-slim type described with reference to FIG. 5. Arrangement of output terminals thereof is different from that shown in FIG. 5. In the present embodiment, output terminals 21 of the IC chip 20 are arranged in order on the upper side of the chip (with odd-numbered output pins provided on the upper side in FIG. 1) and on the lower side of the chip (with even-numbered output pins provided in an example shown in FIG. 1). Each wiring 15 is passed under the IC chip 20, and passed between the output terminals 21 on the upper side of the chip 20, for connection to a corresponding output pad 12. By passing the wiring 15 between the underside of the IC chip 20 and the film substrate 10 as described above, the output terminals 21 are disposed in order in order from first to nth output terminals and connected to corresponding ones of output pads 12 constituted from first to n output pads, on the film substrate 10. Referring to FIG. 1, each of the output pads 12 and the input pads 13 is illustrated as a box specifying an entire region, without being divided into individual segments, for simplicity.

In the present embodiment, the output terminals with odd ordinal numbers ranging from the first, third, fifth, ..., and (i−1)th to the (i+1)th output terminals are sequentially disposed from the left end of the upper side, and the output terminals with even ordinal numbers ranging from the second, fourth, sixth, ..., and (i−2)th to the ith output terminals (where numbers on the lower side and numbers on the upper side constitute serial numbers) are sequentially disposed from the left end of the lower side corresponding to the upper side. The second, fourth, sixth, ..., (i−2)th, and ith output terminals on the lower side are respectively routed to the upper side and connected to the corresponding ones of the output pads 12 through the corresponding ones of wirings 15 which are passed through under the IC chip 20. In an example in FIG. 1, the second output terminal on the lower side, for example, is connected to the corresponding one of the output pads 12 though the wiring $15_2$ led out from between the first and third output terminals on the upper side. An interval between the first and third output terminals is larger than the width of the wiring $15_2$, thus allowing for a space margin. The interconnection on the surface of the film substrate 10 is of a single-layer interconnection structure.

The (i+2)th, (i+3)th, (i+4)th, (i+5)th, ..., (j−3)th, (j−2)th, and (j−1)th output terminals are disposed in the region on the upper side of the chip 20 corresponding to the region in which the input terminals 22 on the lower side of the IC chip 20 are disposed.

Then, on the upper side of the IC chip 20, the (j+1)th, (j+3)th, ..., (n−5)th, (n−3)th, and (n−1)th output terminals are sequentially disposed from a position adjacent to the region corresponding to the region in which the input terminals 22 on the lower side are disposed, toward the other end of the upper side. Then, the jth, (j+2)th, ..., (n−4)th, (n−2)th, and nth output terminals are sequentially disposed on the corresponding lower side. The jth, (j+2)th, ..., (n−4)th, (n−2)th, and nth output terminals are respectively led out to the upper side of the chip 20 through the corresponding ones of the wiring 15 provided under the chip 20 and connected to the corresponding ones of the output pads 12. The nth output terminal on the lower side, for example, is connected to the corresponding one of the output pads 12 (in the right end of the output pads) through the wiring $15_n$ led out from the right side of the (n−1)th output terminal on the upper side.

As shown in FIG. 1, in the present embodiment, the wiring routed from the output terminals on the upper side of the IC chip 20 and the wiring routed from the lower side of the IC chip 20 are expanded fanwise and are connected to the corresponding ones of the output pads 12.

According to the present embodiment with such a configuration, by passing the wiring 15 under the IC chip 20, the area of a wiring region disposed on the surface of the film substrate 10 can be reduced.

Further, according to the present embodiment, each output terminal on an input side is routed between the two output terminals, which are adjacent each other and provided on an output side, through wiring so that outputs are arranged in order on the film substrate 10.

In the present embodiment, the output terminals on the upper side and the output terminals on the lower side are alternately and disposed in order on the IC chip 20 (with the odd-numbered output terminals disposed on the upper side and with the even-numbered output terminal disposed on the lower side). With this layout, an increase in the size of the chip, and an increase in the number of sprocket holes (the number of perforations) in the film substrate 10 are suppressed.

Figure 5:
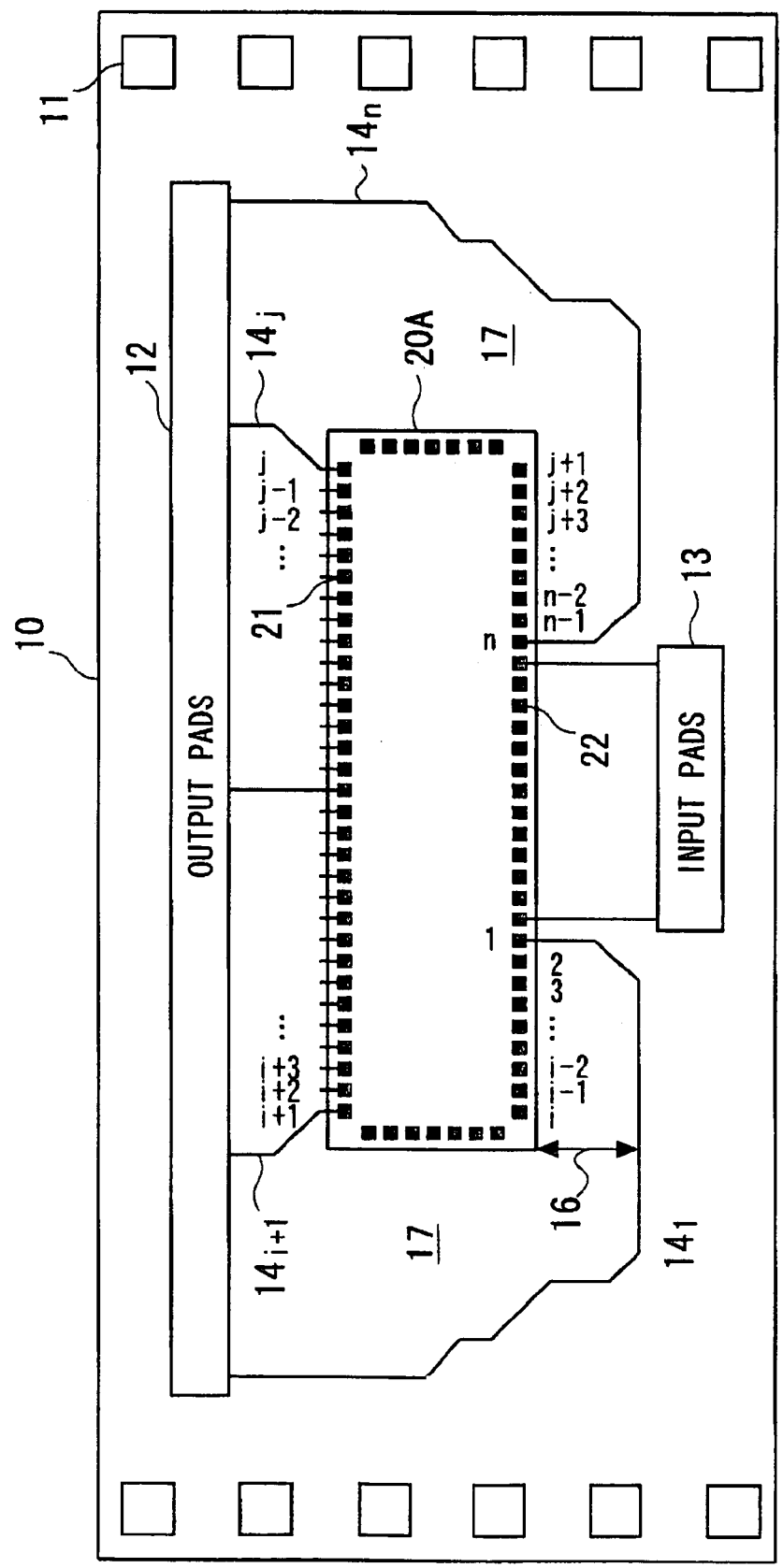
FIG. 5 is a diagram showing a planar configuration of a conventional driver device that uses a chip of a semi-slim type.

When control over rearrangement of the output terminals is performed using the circuit function of the IC chip 20 in the present embodiment, a TCP (tape carrier package), for example, can also be handled. In other words, by switching the order of the output terminals on the lower side of the chip 20 in FIG. 1 to the one as shown in FIG. 5, for example, connection to the output pads 12 is performed by face-up (with a terminal surface used as the top face) wire bonding or the like. This switching of output arrangement may be performed by programmably switching arrangement of the output terminals in FIG. 1 or FIG. 5 by anti-fusing or the like, for example.

On right and left sides (shorter sides) of the chip, output terminals may be further provided, or dummy terminals may be provided.

Figure 6:
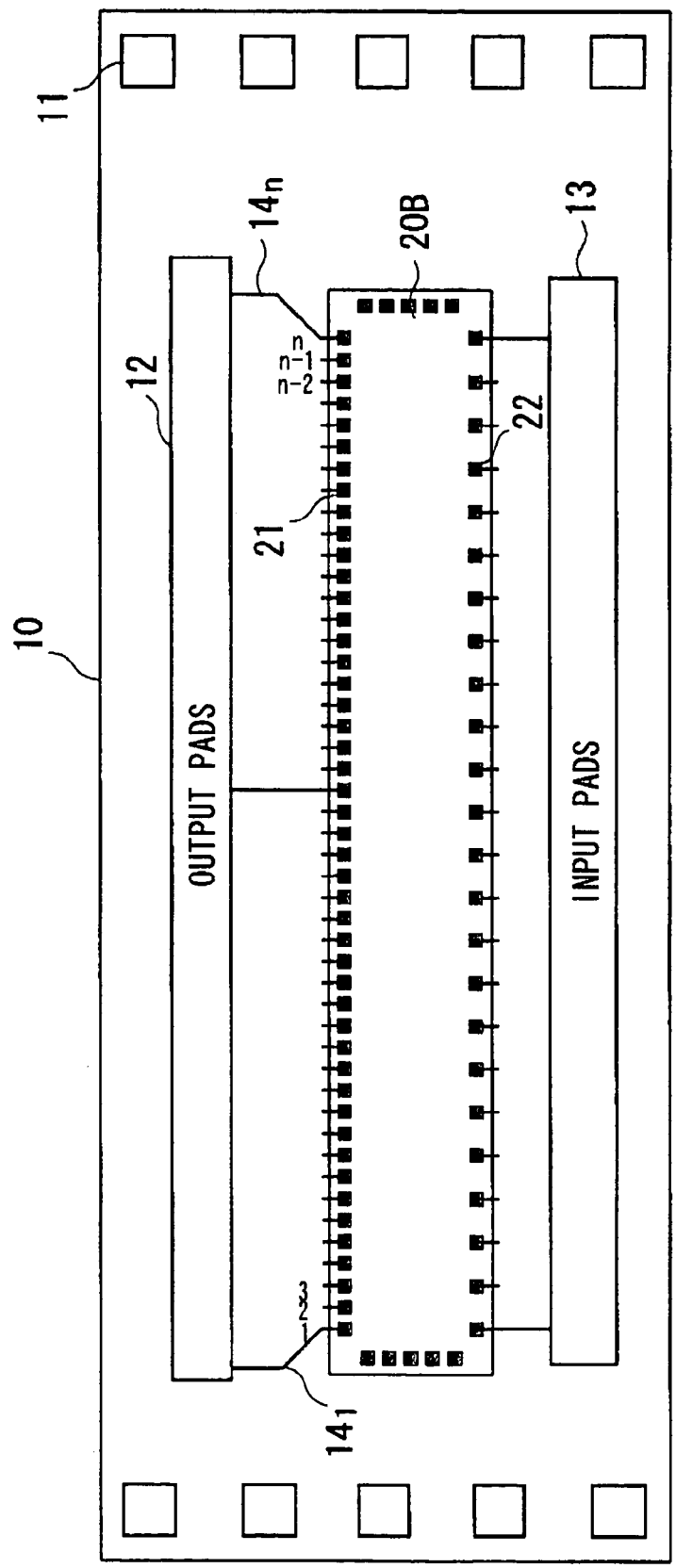
FIG. 6 is a diagram showing a planar configuration of a conventional driver device that uses a chip of a slim type.

According to the present embodiment, the number of sprocket holes 11 (number of perforations) on both sides of the film substrate 10 per device is set to five, which is equal to that in the case of a slim time IC chip 20B shown in FIG. 6. On the other hand, by disposing the output terminals on the upper and lower sides of the IC chip 20 facing to each other, the chip size (of a lateral width) is particularly reduced more than in the slim time IC chip 20B.

Figure 2:
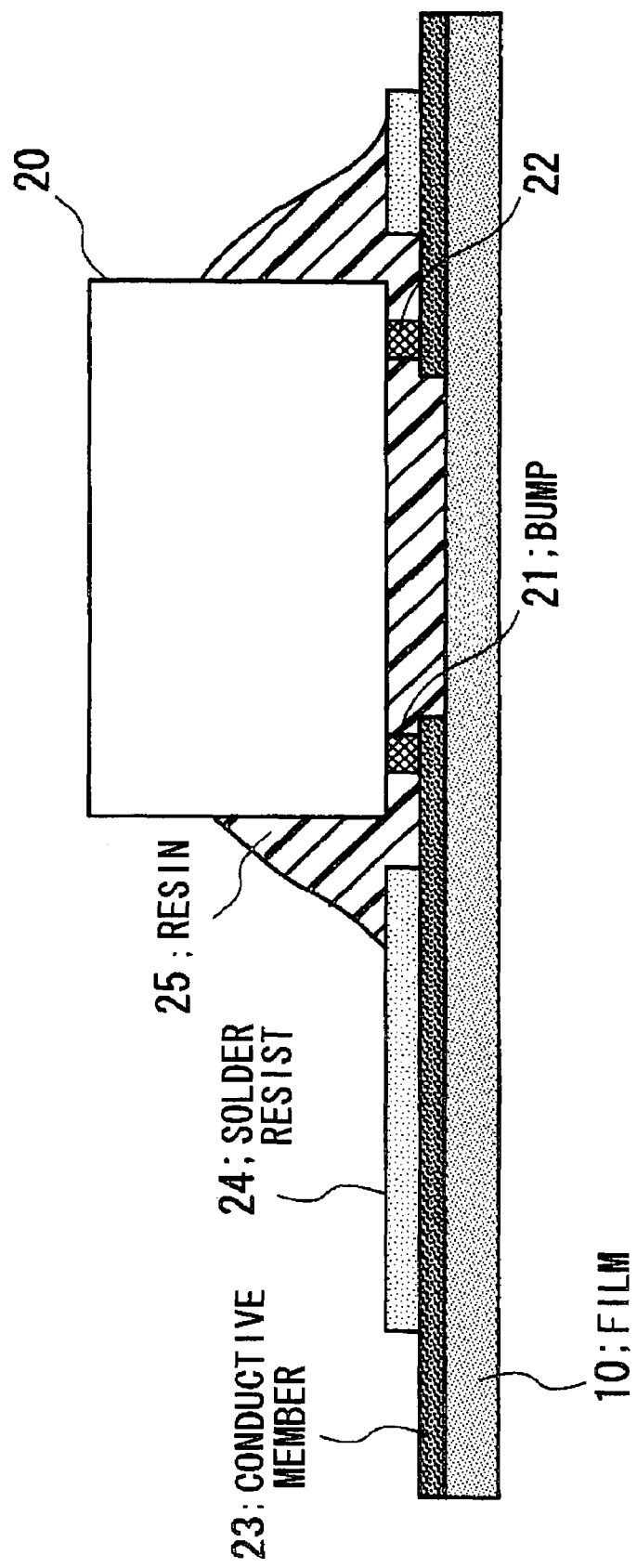
FIG. 2 is a diagram showing a segmental configuration of the embodiment of the present invention.

FIG. 2 is a diagram schematically showing an example of a segmental configuration of the embodiment of the present invention. FIG. 2 shows a packaging configuration using what is called "flip-chip bonding", in which the device surface of an IC (LSI) is mounted on the substrate with the electrodes of the substrate facing to each other. With a bump interposed between the electrode of the IC and the electrode of the substrate, connection between the electrodes is performed. Bumps 21 and 22 (which are solder bumps) are formed on the terminal surface (device surface) of the IC chip 20 and metal-joined to a conductive member 23 (electrode unit) on the film substrate 10. In order to alleviate thermal expansion and a mechanical stress between the chip 20 and the substrate 10, an underfill (resin) 25 is injected between the chip 20 and the substrate 10. A solder resist 24 (which is a permanent-type resist,) was employed for metal-joining of the bumps 21 and 22. Incidentally, the film substrate 10 is formed of polyimide, while the conductive member 23 is formed of copper (or tin plating), for example. The bumps 21 and 22 correspond to an output terminal 21 on one side (upper side) and an input terminal 22 on the opposed side (lower side) of the IC chip 20 in FIG. 1, respectively.

When output terminals on the side of the input pads 13 of the IC chip 20 are routed to the output pad 12 by wiring, wiring (refer to $15_2$, $15_n$, and the like in FIG. 1) formed by a pattern of the same layer as that for the conductive member 23 on the surface of the film substrate 10 (or the single-layer interconnection structure) are routed out under the IC chip 20 from the input terminals 22 to the output terminals 21. In FIG. 2, a description was directed to an example that uses a method of metal joining (solder bump joining). However, a adhesive bonding method using a conductive resin or an anisotropic conductive member may be of course employed. More specifically, any connecting configuration between the electrodes of the chip and the electrodes on the substrate can be employed if the wiring can be extended from one side to the other under the IC chip 20 and insulation can be secured.

Next, the operation and effect of the embodiment described above will be described.

According to the present embodiment, by reducing the wiring space in the film, the area of the film (the number of perforations) can be reduced. Further, the chip can also be implemented by the semi-slim type, so that cost reduction in terms of both the chip and the film can be implemented.

According to the present embodiment, an increase in the wiring space is suppressed, and the area of the film (the number of the sprocket holes) can be reduced. Thus, the cost can be reduced. Then, the chip size is reduced more in the semi-slim type than in the chip of the slim type. Due to downsizing of the chip, the cost can be reduced. As described above, the present embodiment is made suitable for being applied to a display driver device that tends to increase outputs thereof, thus also leading to the cost reduction of a display device provided with the driver device.

Other embodiment of the present invention will be described below. FIG. 3 is a diagram showing a configuration of a second embodiment of the present invention. Referring to FIG. 3, in the second embodiment of the present invention as well, the IC chip 20 such as the data driver, gate driver, or the like is the IC chip of the semi-slim type, as in the embodiment described before. In the present embodiment, arrangement of the output terminals 21 is different from that in the embodiment described before, shown in FIG. 1.

Referring to FIG. 3, in the present embodiment, one output terminal 21 is provided on the lower side of the IC chip 20, corresponding to two of the output terminals 21 on the upper side of the IC chip 20. As in the embodiment described before, the one output terminal 21 is extended between the corresponding two of the output terminals 21 and connected to the corresponding one of the pads among the output pads 12 through the wiring (such as $15_2$) that passes under the IC chip 20. That is, the IC chip 20 according to the present embodiment has such a layout in which one output terminal on the lower side is arranged for the respective two of the output terminals on the upper side that constitutes the output side. More specifically, as shown in FIG. 3, the wiring $15_2$ connected to the second output terminal provided on the lower side is extended under the IC chip 20, passes through between the first and third output terminals provided on the upper side, and is connected to the corresponding one of the output pads 12. The wiring $15_5$ connected to the fifth output terminal provided on the lower side is extended under the IC chip 20, passes through between the fourth and sixth output terminals provided on the upper side, and is connected to the corresponding one of the output pads 12. Likewise, the wiring $15_{n-1}$ connected to the (n−1)th output terminal provided on the lower side is extended under IC chip 20, passes through between the (n−2)th and nth output terminals provided on the upper side, and is connected to the corresponding one of the output pads 12.

In FIG. 3, one output terminal is provided on the lower side for two output terminals on the upper side. However, one output terminal may be of course provided on the lower side for n output terminals provided on the upper side, in which n is an integer equal to or larger than three.

FIG. 4 is a diagram showing a configuration of a third embodiment of the present invention. In the third embodiment of the present invention as well, the IC chip 20 such as the data driver, gate driver, or the like is the IC chip of the semi-slim type, and arrangement of the output terminals is different from that in the embodiment described before, shown in FIG. 1. Referring to FIG. 4, in the central portion of the IC chip 20 in the present embodiment, a logic unit (a logic block) is arranged. Reference numeral 26 in FIG. 4 shows a logic unit region. For this reason, there is an unoccupied region in which no output terminals are disposed (a segment defined by broken lines of the logic unit region 26), corresponding to the logic unit region 26, in a part of the upper side in FIG. 4. In the present embodiment, the output terminals on the lower side of the IC chip 20 are routed through the unoccupied region on the upper side and are connected to the corresponding ones of the output pads 12 by the wiring (that passes under the IC chip 20). On the upper side of the IC chip 20, for example, the first to the ith (in which i is larger than one) output terminals are disposed in order on the left side of the logic unit region 26, and the (m+1)th to the nth output terminals (in which n is larger than (m+1)) are disposed in order on the right side of the logic unit region 26. On the lower side of the IC chip 20, the (i+1)th to the jth (in which j is larger than (i+1)) output terminals are disposed in order on the left side of the logic unit region 26, and the (j+1)th to the mth output terminals (in which m is larger than (j+1)) are disposed in order on the right side of the logic unit region 26. Then, the (i+1)th to jth output terminals and the (j+1)th to mth output terminals on the lower side are extended even to the unoccupied region on the upper side and are connected to the corresponding ones of the output pads 12 through the wiring $15_{i+1}$ to $15_m$, respectively. When the number of the output terminals disposed on the lower side is relatively large (when the width of the logic unit region is narrow with respect to the longer side of the chip), the present embodiment may be used in combination with the configuration of the second embodiment in which one output terminal is disposed on the lower side for n output terminals on the upper side, and the output terminals on the lower side are led out to a portion between the output terminals on the upper side and connected to the corresponding ones of the output pads 12 through the wiring under the IC chip 20.

In the embodiments described above, a description was given with a COF taken as an example. The invention, however, can also be likewise applied to a COG. In the embodiments described above, the description was given with the driver IC chip taken as an example. The invention, however, can be of course applied to an arbitrary IC chip and an arbitrary LSI chip in which a plurality of output terminals are disposed, for example.

The foregoing description was given in connection with the embodiments described above. The present invention is not limited to the configurations of the embodiments described above alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
    a semiconductor chip having a plurality of terminals arranged on a first side thereof and a plurality of terminals arranged on a second side thereof, said second side facing said first side; and
    a substrate including at least a wiring on a surface thereof, said wiring being extended under said semiconductor chip from a terminal connection provided at a position corresponding to one of the terminals on said second side of said semiconductor chip and being led out at said first side of said semiconductor chip between or beside associated ones of the terminals on at least said first side of said semiconductor chip.

2. The semiconductor device according to claim 1, wherein said semiconductor chip comprises one of a data driver IC chip for driving a data line of a display device and a gate driver IC chip for driving a gate line of said display device.

3. The semiconductor device according to claim 1, wherein said substrate comprises one of a film substrate and a glass substrate.

4. The semiconductor device according to claim 1, wherein said terminal of said semiconductor chip is formed of a bump protruded from a surface of said semiconductor chip; and
    wherein connection is performed by contact of said bump against an electrode provided at the terminal connection on said substrate, said electrode being associated with said bump.

5. The semiconductor device according to claim 1, wherein said substrate further comprises a plurality of signal electrodes on the surface thereof, said signal electrodes being separated from said first side of said semiconductor chip, facing said first side, and being connected to the terminals on said first side and the terminals on said second side by the wiring.

6. The semiconductor device according to claim 5, wherein said substrate comprises a film substrate; and
    wherein said first side of said semiconductor chip and said signal electrodes are disposed in a direction perpendicular to a direction in which sprocket holes provided along an edge of at least one side of said film substrate are arranged.

7. The semiconductor device according to claim 1, wherein said semiconductor chip includes:
    a plurality (k) of the terminals for output, arranged in order in a first segment extending over a predetermined width from one end of said first side, said plurality of the terminals for output in said first segment being one of output terminals with even ordinal numbers and output terminals with odd ordinal numbers; and
    a plurality (k) of the terminals for output, arranged in order in a second segment extending over the predetermined width from one end of said second side, said plurality of the terminals for output in said second segment being the other of the output terminals with the even ordinal numbers and the output terminals with the odd ordinal numbers.

8. The semiconductor device according to claim 7, wherein said semiconductor chip includes:
    a third segment extending over a predetermined width from the other end of said first segment of said first side; and
    a fourth segment extending over a predetermined width from the other end of said second segment of said second side;
    plurality (m) of the terminals for output, arranged in order from an end of said third segment of said first side to the other end of said first side, said plurality of the terminals for output being one of the output terminals with even ordinal numbers and output terminals with odd ordinal numbers; and
    a plurality (m) of the terminals for output, arranged in order from an end of said fourth segment of said second side to the other end of said second side, said plurality of the terminals for output being the other of the output terminals with the even ordinal numbers and the output terminals with the odd ordinal numbers.

9. The semiconductor device according to claim 8, wherein said semiconductor chip includes:
   a plurality of the terminals for output arranged in order in said third segment; and
   a plurality of the terminals for input in said fourth segment.

10. The semiconductor device according to claim 1, wherein said semiconductor chip includes:
   a plurality (k) of the terminals for output with odd ordinal numbers, arranged in order in a first segment extending over a predetermined width from one end of said first side; and
   a plurality (k) of the terminals for output with even ordinal numbers, arranged in order in a second segment extending over the predetermined width from one end of said second side;
   wherein each of the terminals for output arranged in said second segment of said second side is routed between adjacent ones of the terminals for output on said first side by the wiring extending from the associated terminal connection on a surface of said substrate; and
   wherein 2×k terminals for output arranged in said first segment of said first side are connected in order to 2×k signal electrodes arranged corresponding to said first segment of said first side, respectively.

11. The semiconductor device according to claim 10, wherein said semiconductor chip includes:
   a plurality of the terminals for output, arranged in order in a third segment, said third segment extending over a predetermined width from the other end of said first segment of said first side;
   a plurality of the terminals for input, arranged in order in a fourth segment, said fourth segment extending over a predetermined width from the other end of said second segment of said second side;
   a plurality (m) of the terminals for output, with odd ordinal numbers, arranged in a fifth segment, said fifth segment extending from an end of said first segment of said first side to the other end of said first side; and
   a plurality (m) of the terminals for output, with even ordinal numbers, arranged in a sixth segment, said sixth segment extending from an end of said fourth segment of said second side to the other end of said second side;
   wherein each of the terminals for output arranged in said sixth segment of said second side is routed between adjacent ones of the output terminals in said fifth segment of said first side by the wiring extending from the associated terminal connection on said substrate; and
   wherein 2×m terminals for output arranged in said fifth segment of said first side are connected in order to 2×m signal electrodes arranged corresponding to said fifth segment of said first side, respectively.

12. A semiconductor device comprising:
   a semiconductor chip having a plurality of terminals arranged on a first side thereof and a plurality of terminals arranged on a second side thereof, said second side facing said first side; and
   a substrate including at least a wiring on a surface thereof, said wiring being extended under said semiconductor chip from a terminal connection provided at a position corresponding to one of the terminals on said second side of said semiconductor chip and being led out between or beside associated ones of the terminals on at least said first side of said semiconductor chip,
   wherein said semiconductor chip includes:
      a plurality of terminal groups provided on said first side, each of said plurality of terminal groups having n of the terminals among (n+1) of the terminals (where n is an integer equal to one or larger); and
      a remaining one of the (n+1) of the terminals provided on said second side, the remaining one of the (n+1) of the terminals corresponding to each of said plurality of terminal groups on said first side; and
      the remaining one of the (n+1) of the terminals on said second side is routed between adjacent two of the terminals in a corresponding one of said plurality of terminal groups on said first side by the wiring extended under said semiconductor chip from the terminal connection provided at a position corresponding to the remaining one of the (n+1) of the terminals.

13. The semiconductor device according to claim 1, wherein said semiconductor chip comprises:
   a plurality of output terminal groups provided in a first segment, said first segment extending between one end of said first side and the other end of said first side, each of said plurality of output terminal groups comprising n of the terminals for output among (n+1) of the terminals for output (where n is an integer equal to one or larger), the (n+1) output terminals being serially numbered;
   a remaining one of the (n+1) of the serially numbered output terminals provided in a second segment and a third segment, said second segment extending over a predetermined width from one end of said second side, said third segment extending over a predetermined width from the other side of said second side facing said one end of said second side, the remaining one of the (n+1) of the serially numbered output terminals corresponding to each of said plurality of output terminal groups on said first side; and
   a plurality of the terminals for input provided in a region between said second and third segments of said second side; and
   each of the output terminals on said second side is routed between associated two output terminals in a corresponding one of said plurality of output terminal groups on said first side by the wiring extended under said semiconductor chip from the terminal connection provided at the position corresponding to said each of the output terminals on said second side.

14. The semiconductor device according to claim 1, wherein said semiconductor device chip includes in a region of said first side a free space with no terminals disposed thereon; and
   at least one of the terminals on said second side is routed to said free space on said first side by the wiring.

15. The semiconductor device according to claim 1, wherein on said semiconductor chip,
   first through ith ones of the terminals for output (in which i is larger than one) are arranged in order in a first segment extending over a predetermined width from one end of said first side;
   (i×1)th through jth ones of the terminals for output (where j is larger than (i+1)) are arranged in order in a second segment extending over the predetermined width from one end of said second side;
   (m×1)th through nth ones of the terminals for output (where n is larger than (m+1)) are arranged in order in a third segment in a direction from said one end of said first side to the other end of said first side, said third segment extending over a predetermined width from said other end of said first side;

(j+1)th through mth ones of the terminals for output (where m is larger than (j+1)) are arranged in order in a fourth segment in a direction from said one end of said second side to the other end of said second side, said fourth segment extending over the predetermined width from said other end of said second side;

a free space with no terminals disposed therein is provided in a region between said first and third segments of said first side; and each of said (i+1) through jth output terminals in said second segment and said (j+1)th through mth output terminals in said fourth segment of said second side is routed to said free space on said first side by the wiring extended under said semiconductor chip from the terminal connection provided at the position corresponding to said each of said (i+1) through jth output terminals and said (j+1)th through mth output terminals and is connected to a corresponding signal electrode.

16. A substrate for mounting a semiconductor chip thereon, said semiconductor chip having a plurality of terminals along a first side thereof and a plurality of terminals along a second side thereof, said second side facing said first side, said substrate comprising:

a wiring provided on a surface of said substrate, said wiring being extended from a terminal connection provided at a position corresponding to at least one of said plurality of terminals on said second side of said semiconductor chip, and being led out at said first side of said semiconductor chip from between associated ones of said plurality of terminals on said first side of said semiconductor chip or from beside said plurality of terminals on at least said first side of said semiconductor chip.

17. The substrate according to claim 16, wherein said substrate comprises one of a film substrate and a glass substrate.

18. A display apparatus including a display driver device; wherein said display driver device comprises the semiconductor device as defined in claim 1.

19. The display apparatus according to claim 18, wherein said semiconductor chip constitutes a display driver IC chip; and wherein said display driver device further comprises:

a plurality of signal output electrodes provided on said substrate; and a plurality of signal input electrodes provided on said substrate;

said semiconductor chip having a plurality of input terminals thereof connected to said signal input electrodes and a plurality of output terminals thereof connected to said signal output electrodes;

wherein there are provided a plurality of the output terminals on the first side of said semiconductor chip, said first side facing said signal output electrodes; said second side of said semiconductor chip in an opposite side of said first side facing said signal input electrodes; and a plurality of input terminals in at least one segment of said second side and the output terminals in at least one portion of a remaining segment of said second side;

at least one of the output terminals on said second side being routed through between associated two of said plurality of the output terminals on said first side corresponding to said at least one of the remaining ones of the output terminals to be connected to a corresponding one of said signal output electrodes, by a wiring passing through under a surface of said semiconductor chip, said surface facing said substrate.

20. The semiconductor device according to claim 1, wherein said wiring is led out between ones of the terminals on said first side of said semiconductor device.

21. A semiconductor device comprising:

a semiconductor chip having a plurality of terminals arranged on a first side thereof and a plurality of terminals arranged on a second side thereof, said second side facing said first side; and a substrate including at least a wiring on a surface thereof, said wiring being extended under said semiconductor chip from a terminal connection provided at a position corresponding to one of the terminals on said second side of said semiconductor chip and being led out between or beside associated ones of the terminals on at least said first side of said semiconductor chip, wherein on said semiconductor chip, at least one of the terminals along said first side is arranged in offset position to the terminals along said second side, at least one of said wiring being extended under said semiconductor chip from said terminal connection provided at a position corresponding to at least one of the terminals on said second side of said semiconductor chip, and being led out from between the terminals on said first side of semiconductor chip, is rectilineal.

* * * * *